US006762960B2

(12) United States Patent
Natori

(10) Patent No.: US 6,762,960 B2
(45) Date of Patent: Jul. 13, 2004

(54) BOOSTER CIRCUIT FOR NON-VOLATILE SEMICONDUCTOR MEMORY DEVICE

(75) Inventor: Kanji Natori, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/338,833

(22) Filed: Jan. 9, 2003

(65) Prior Publication Data
US 2003/0146450 A1 Aug. 7, 2003

(30) Foreign Application Priority Data
Jan. 24, 2002 (JP) ........................................ 2002-016046

(51) Int. Cl.⁷ ................................................. G11C 7/00
(52) U.S. Cl. .................... 365/189.09; 365/226; 365/229
(58) Field of Search ........................... 365/189.09, 226, 365/229

(56) References Cited

U.S. PATENT DOCUMENTS

| 5,408,115 | A | | 4/1995 | Chang |
| 5,422,504 | A | | 6/1995 | Chang et al. |
| 5,494,838 | A | | 2/1996 | Chang et al. |
| 5,969,383 | A | | 10/1999 | Chang et al. |
| 6,177,318 | B1 | | 1/2001 | Ogura et al. |
| 6,248,633 | B1 | | 6/2001 | Ogura et al. |
| 6,255,166 | B1 | | 7/2001 | Ogura et al. |
| 6,429,725 | B1 | * | 8/2002 | Tanzawa et al. ............. 327/536 |
| 6,492,863 | B2 | * | 12/2002 | Kono et al. .................. 327/538 |
| 6,563,746 | B2 | * | 5/2003 | Fujioka et al. ......... 365/189.09 |

FOREIGN PATENT DOCUMENTS

| JP | A 7-161851 | 6/1995 |
| JP | B1 2978477 | 9/1999 |
| JP | A 2001-156188 | 6/2001 |

OTHER PUBLICATIONS

U.S. patent application Ser. No. 09/955,158, Kanai et al., filed Sep. 19, 2001.
U.S. patent application Ser. No. 09/955,160, Kanai et al., filed Sep. 19, 2001.
U.S. patent application Ser. No. 10/115,913, Kamei, filed Apr. 5, 2002.
U.S. patent application Ser. No. 10/115,956, Kamei, filed Apr. 5, 2002.
U.S. patent application Ser. No. 10/153,611, Owa, filed May 24, 2002.
U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/193,066, Kanai, filed Jul. 12, 2002.
U.S. patent application Ser. No. 10/193,602, Kanai, filed Jul. 12, 2002.
U.S. patent application Ser. No. 10/197,643, Kanai et al., filed Jul. 18, 2002.

(List continued on next page.)

Primary Examiner—Vu A. Le
(74) Attorney, Agent, or Firm—Oliff & Berridge, plc

(57) ABSTRACT

A booster circuit for a non-volatile semiconductor memory device has a drive control circuit. At a power supply ON time or at a reset time, in response to an externally input power supply ON/reset signal ON/RS, the drive control circuit does not drive a weak charge pump but drives a strong charge pump, which has a greater current capacity than that of the weak charge pump, even in a standby mode. This arrangement enables a boosted voltage HV to quickly rise from 0 V to a standby voltage, thus desirably shortening an initial access permission time at the power supply ON time or at the reset time.

14 Claims, 5 Drawing Sheets

OTHER PUBLICATIONS

U.S. patent application Ser. No. 10/197,644, Kamei, filed Jul. 18, 2002.
U.S. patent application Ser. No. 10/197,645, Natori, filed Jul. 18, 2002.
U.S. patent application Ser. No. 10/197,646, Kanai, filed Jul. 18, 2002.
U.S. patent application Ser. No. 10/197,668, Kanai, filed Jul. 18, 2002.
U.S. patent application Ser. No. 10/229,064, Kamei, filed Aug. 28, 2002.
U.S. patent application Ser. No. 10/246,486, Natori, filed Sep. 19, 2002.
U.S. patent application Ser. No. 10/246,665, Natori, filed Sep. 19, 2002.
U.S. patent application Ser. No. 10/246,708, Natori, filed Sep. 19, 2002.
U.S. patent application Ser. No. 10/246,727, Natori, filed Sep. 19, 2002.
U.S. patent application Ser. No. 10/323,921, Natori, filed Dec. 20, 2002.
U.S. patent application Ser. No. 10/338,834, Natori, filed Jan. 9, 2003.
Hayashi et al., "Twin MONOS Cell with Dual Control Gates", 2000 IEEE VLSI Technology Digest of Technical Papers.
Chang et al., "A New SONOS Memory Using Source–Side Injection for Programming", IEEE Electron Device Letters, vol. 19, No. 7, Jul. 1998, pp. 253–255.
Chen et al., "A Novel Flash Memory Device with S Plit Gate Source Side Injection and ONO Charge Storage Stack (SPIN)", 1997, VLSI Technology Digest, pp. 63–64.

* cited by examiner

BOOSTER CIRCUIT FOR NON-VOLATILE SEMICONDUCTOR MEMORY DEVICE

BACKGROUND OF THE INVENTION

1. Field of the Invention

The present invention relates to a voltage generation circuit for a non-volatile semiconductor memory device. More specifically the invention pertains to a booster circuit that generates a boosted voltage from a power source voltage according to an operation mode.

2. Description of the Related Art

A semiconductor memory device has a memory cell array, in which multiple memory cells are arranged in a matrix. Data reading, programming or writing, and erasing operations with regard to each memory cell are generally carried out by specifying an address in a row direction and a column direction of the memory cell array.

Regulation of a voltage applied to a signal line in the row direction and to a signal line in the column direction connected to each memory cell enables an access to the memory cell, in order to carry out a predetermined operation out of the data reading, programming, and erasing operations. For selection of a certain memory cell, a specific voltage, which is different from a voltage applied to the other memory cells, is generated from a power source voltage and is applied to the certain memory cell.

Recently developed MONOS (Metal Oxide Nitride Oxide Semiconductor or Substrate)-type non-volatile semiconductor memory devices are non-volatile and enable electrical erasing of data. In the MONOS-type non-volatile semiconductor memory device, each memory cell has two memory elements as discussed in a reference Y. Hayashi, et al., 2000 Symposium on VLSI Technology Digest of Technical Papers, pp. 122–123.

As described in this cited reference, in order to gain access to the respective memory elements in such a MONOS-type non-volatile semiconductor memory device, it is required to set, as control voltages, a plurality of different voltages corresponding to the respective signal lines (control lines), which depend upon the number of the memory cells. Different control voltages are also required corresponding to respective operation modes (data reading, data programming, data erasing, and standby modes) with regard to each memory element.

A voltage generation circuit generates such a control voltage. The voltage generation circuit typically includes a booster circuit that boosts the power source voltage according to each of diverse operation modes, and a control voltage generation circuit that receives the boosted voltage and generates a plurality of different control voltages required for the respective operation modes. The booster circuit boosts a power source voltage of, for example, 1.8 V to a high voltage of 8.0 V and outputs the high voltage of 8.0 V as the boosted voltage in the data programming or writing mode and in the data erasing mode, while boosting the power source voltage to a low voltage of 5.0 V and outputs the low voltage of 5.0 V as the boosted voltage in the data reading mode and in the standby mode. The MONOS memory cell requires a higher voltage than the power source voltage in the data reading mode. Generation of a higher voltage than the power source voltage is also required in the standby mode, in order to shorten an access time in which the operation mode is changed over from the standby mode to the data reading mode. The boosted voltage of 5.0 V in the standby mode may hereafter be referred to as the standby voltage.

An access to the memory element is required in the active modes, for example, in the data reading mode, in the data programming mode, and in the data erasing mode, among the operation modes. The memory cell array accordingly requires a large electric power. In the standby mode, on the other hand, no access to the memory element is required. It is accordingly desirable to reduce the current consumption in the standby mode.

A proposed booster circuit has a first booster module having a large current capacity supplied to a loading (for example, a memory cell array) and a second booster module having a smaller current capacity and thereby a less current consumption than those of the first booster module. In the active mode, the first booster module having the large current capacity is used to boost the power source voltage and ensure a sufficient supply of electric power required for the memory cell array. In the standby mode, on the other hand, while the first booster module is at a stop, the second booster module having the smaller current capacity and thereby the less current consumption is driven and used to boost the power source voltage. This arrangement reduces the current consumption by the booster circuit in the standby mode.

The proposed booster circuit, however, has some problems discussed below at the power supply ON time or at the reset time of the non-volatile semiconductor memory device.

Immediately after the power supply ON time or the reset time of the non-volatile semiconductor memory device, the memory device is in the standby mode. In the booster circuit, the second booster module is accordingly driven, while the first booster module is kept at a stop. At the power supply ON time or at the reset time, however, the boosted voltage output from the booster circuit is initially close to the power source voltage. It is required to quickly raise the boosted voltage from the power source voltage level to the standby voltage level (for example, 5.0 V). The second booster module has the smaller current capacity and thus requires an undesirably long time to raise the boosted voltage from the power source voltage to the standby voltage. This results in extending the time period between the power supply ON time or the reset time and the time to permit an access to the memory element (initial access permission time).

SUMMARY OF THE INVENTION

The advantage of the present invention is thus to solve the problems of the prior art technique discussed above and to provide a booster circuit for a non-volatile semiconductor memory device, which shortens an initial access permission time at a power supply ON time or at a reset time.

In order to attain at least part of the above and the other objects, the present invention is directed to a booster circuit applied for a non-volatile semiconductor memory device, which includes a memory cell array of multiple non-volatile memory elements and has multiple operation modes including a plurality of active modes to permit an access to one of the multiple non-volatile memory elements and a standby mode to stand ready for an access to one of the multiple non-volatile memory elements. The booster circuit boosts a power source voltage and outputs a boosted voltage according to each of the operation modes. The booster circuit includes: a first booster module that is driven in each of the active modes to boost the power source voltage to a specified voltage according to the active mode and output the specified voltage as the boosted voltage; a second booster module that has a smaller current capacity supplied to the memory cell array than that of the first booster module, and is driven in the standby mode to boost the power source voltage to a standby voltage according to the standby mode and outputs the standby voltage as the boosted voltage; and a drive control module that controls actuation of the first booster module and the second booster module. At a power supply ON time or at a reset time of the non-volatile semiconductor memory device, the drive control module actuates the first booster module to make the boosted voltage rise to the standby voltage even when the operation mode is the standby mode.

At the power supply ON time or at the reset time, the first booster module is driven and used to boost the power source voltage. The first booster module has the greater current capacity and thereby enables the boosted voltage to be quickly raised from the power source voltage to the standby voltage, compared with the second booster module. This arrangement significantly shortens the time period required for boosting the voltage to the standby voltage level, thus remarkably reducing the time period between the power supply ON time or the reset time and the time to permit an access to the memory element (initial access permission time).

In one preferable application of the booster circuit of the present invention, the drive control module stops the first booster module and actuates the second booster module, when it is detected that the boosted voltage reaches the standby voltage.

After the boosted voltage reaches the standby voltage, the requirement is to keep the standby voltage in the standby mode. No problem accordingly arises when the second booster module having the smaller current capacity is driven and used to boost the power source voltage. The arrangement stops the first booster module having greater current consumption in proportion to the greater current capacity, while actuating the second booster module having smaller current consumption in proportion to the smaller current capacity. This effectively reduces the total current consumption by the booster circuit in the standby mode.

In the booster circuit of the present invention, each of the non-volatile memory elements in the non-volatile semiconductor memory device, for which the booster circuit is applied, may be a twin memory cell controlled by one word gate and two control gates.

This arrangement allows operations in multiple operation modes, for example, a data reading mode, a data programming mode, and a data erasing mode, with regard to the memory cell array of multiple twin memory cells.

In the booster circuit of the present invention, each of the non-volatile memory elements in the non-volatile semiconductor memory device, for which the booster circuit is applied, may have an ONO membrane that includes an oxide film (O), a nitride film (N), and an oxide film (O) and functions as a trap site of electric charges.

This arrangement enables the booster circuit to boost the power source voltage in a device using MONOS non-volatile memory elements.

In one preferable embodiment of the present invention, each of the first booster module and the second booster module includes: an oscillation circuit that carries out an oscillating operation to output a clock signal; a charge pump circuit that boosts the power source voltage and outputs the boosted voltage, in response to the clock signal output from the oscillation circuit; and a level sense circuit that controls the oscillating operation of the oscillation circuit to make the boosted voltage output from the charge pump circuit equal to a predetermined setting voltage according to each of the operation modes. The drive control module stops the first booster module or the second booster module by stopping the oscillating operation of the oscillation circuit included in the booster module.

This arrangement enables the first booster module or the second booster module to be readily stopped according to the requirements.

The present invention is not restricted to the applications of the booster circuit discussed above, but is actualized by a diversity of other applications, for example, a voltage generation circuit including the booster circuit and a non-volatile semiconductor device including the booster circuit.

The above and other objects, features, aspects, and advantages of the present invention will become more apparent from the following detailed description of the preferred embodiment with the accompanying drawings.

DESCRIPTION OF THE PREFERRED EMBODIMENT

Figure 1:
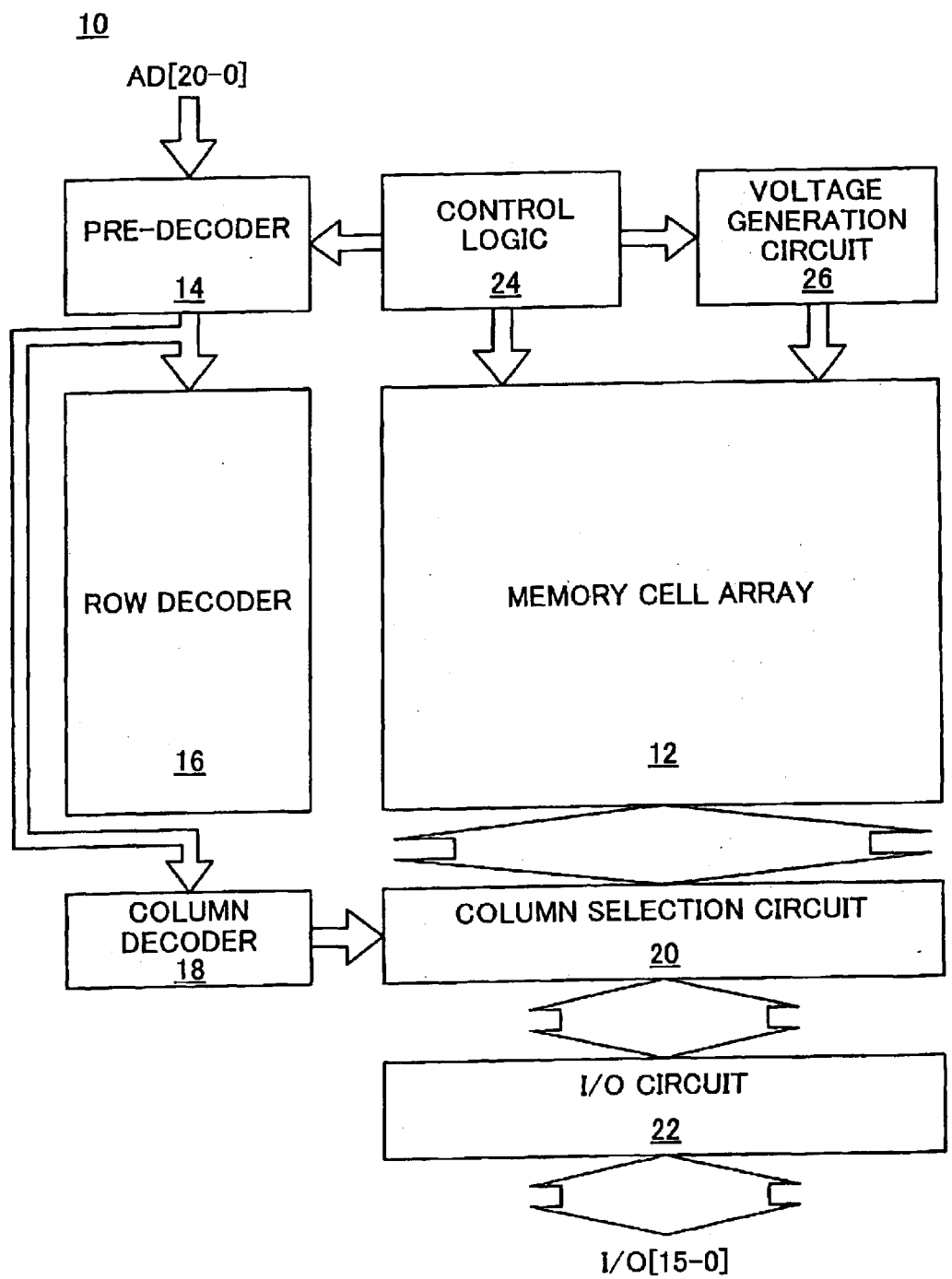
FIG. 1 is a block diagram schematically illustrating the general construction of a typical non-volatile semiconductor memory device.

One mode of carrying out the present invention is discussed below as a preferred embodiment in the following sequence:

A. Construction and Operations of Non-volatile Semiconductor Memory Device
 B. Structure and Operations of Memory Cells
 C. Structure and Operations of Voltage Generation Circuit
 D. Structure and Operations of Booster Circuit
  D-1. Operations at Power Supply ON Time or at Reset Time
  D-2. Operations after Reach to Standby Voltage
  D-3. Operations at Operation Mode Changeover Time
  D-4. Effects of Embodiment
 E. Modifications
 A. Construction and Operations of Non-volatile Semiconductor Memory Device FIG. 1 is a block diagram schematically illustrating the general construction of a typical non-volatile semiconductor memory device 10. The non-volatile semiconductor memory device 10 mainly includes a memory cell array 12, a pre-decoder 14, a row decoder 16, a column decoder 18, a column selection circuit 20, an I/O circuit 22, a control logic 24, and a voltage generation circuit 26. The non-volatile semiconductor memory device 10 also has a diversity of other circuits (not shown) including an address buffer, an input-output buffer, a control buffer, and a sense amplifier. For simplicity of explanation, these circuit elements are omitted from the illustration of FIG. 1.

The pre-decoder 14, the row decoder 16, and the column decoder 18 function to decode an address signal, which specifies a selected non-volatile memory element (selected cell) included in the memory cell array 12. In the example of FIG. 1, a 21-bit address signal AD[20-0] is input into the pre-decoder 14.

The column selection circuit 20 selects a bit line corresponding to a selected cell specified by the column decoder 18 and connects the selected bit line to a circuit, such as a sense amplifier, included in the I/O circuit 22. The I/O circuit 22 implements output of reading data or input of writing data.

The control logic 24 generates and outputs control signals in response to diverse control inputs (not shown), for example, a control signal to the voltage generation circuit 26.

The voltage generation circuit 26 is controlled by the control logic 24 and generates multiple control voltages applied to the memory cell array 12.

B. Structure and Operations of Memory Cells

Figure 2:
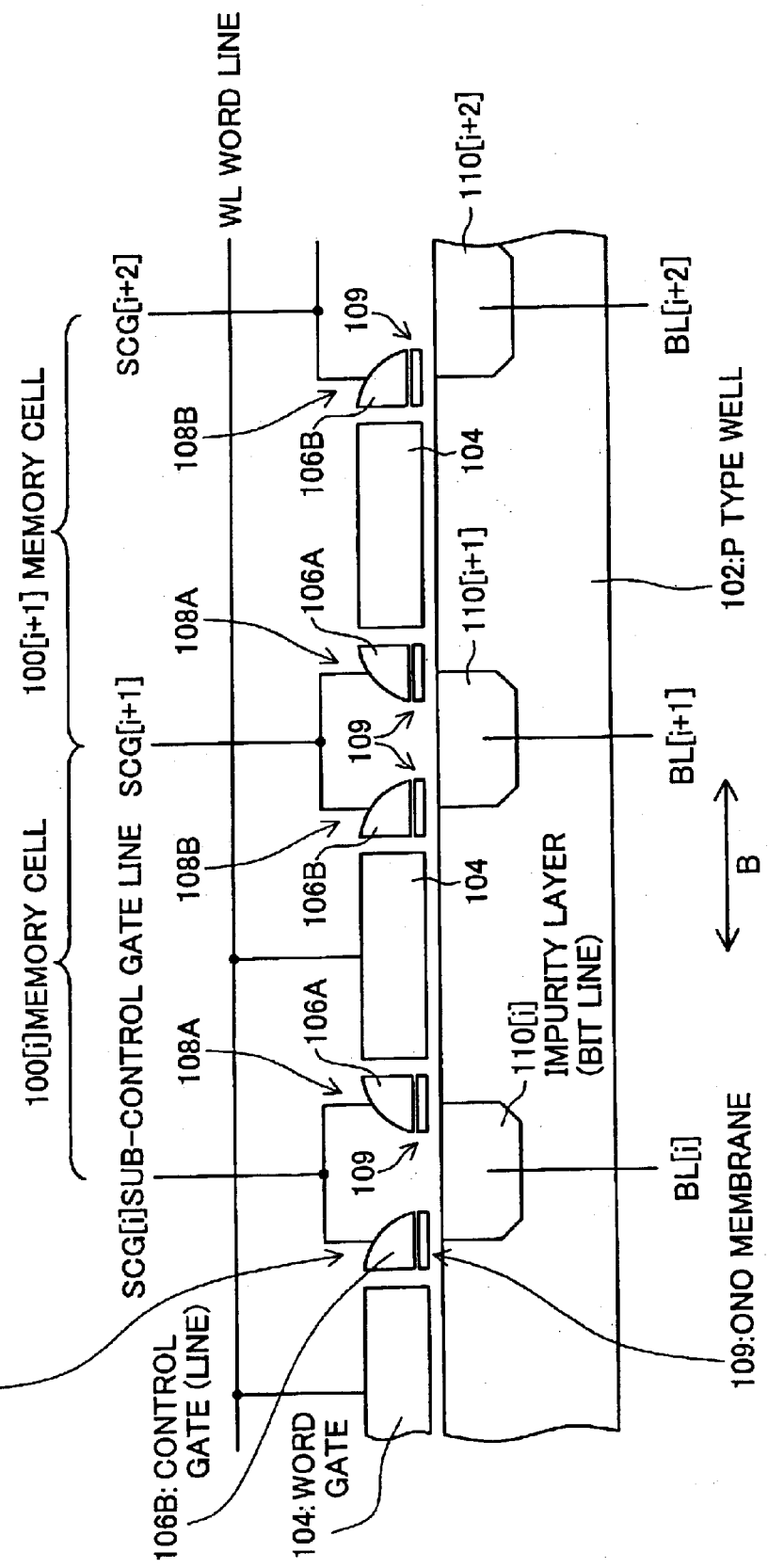
FIG. 2 is a sectional view schematically illustrating the structure of twin memory cells.

The following describes the structure and the operations of twin memory cells 100 used as the memory elements constituting the memory cell array 12. FIG. 2 is a sectional view schematically illustrating the structure of the twin memory cells 100.

Referring to FIG. 2, multiple twin memory cells 100 ( . . . , 100[i], 100[i+1], . . . : i is an integer of not less than 1) are arrayed in a direction B (hereafter referred to as a row direction or a word line direction) on a P type well 102. The twin memory cells 100 are also arrayed in multiple columns in a column direction (that is, a direction perpendicular to the sheet surface of FIG. 2: hereafter may also be referred to as a bit line direction). Namely the memory cell array 12 has the twin memory cells 100 arranged in a matrix.

Each twin memory cell 100 has a word gate 104 formed on the P type well 102 via a gate insulating film, a first memory element (MONOS memory element) 108A with a first control gate 106A, and a second memory element (MONOS memory element) 108B with a second control gate 106B.

Each of the first and the second memory elements 108A and 108B has an ONO membrane 109, which is a laminate of an oxide membrane (O), a nitride membrane (N), and an oxide membrane (O), on the P type well 102. The ONO membrane 109 traps electric charges. The first control gate 106A and the second control gate 106B are respectively formed on the ONO membranes 109 of the first and the second memory elements 108A and 108B. The working conditions of the first and the second MONOS memory elements 108A and 108B are controlled by the first and the second control gates 106A and 106B, which are composed of polysilicon corresponding to M (metal) of the MONOS. The first and the second control gates 106A and 106B may be composed of a conductive material, such as a silicide.

The word gate 104, which is composed of a material, for example, a polysilicon-containing material, is formed between the first and the second memory elements 108A and 108B to be electrically insulated from the first and the second memory elements 108A and 108B. Selection of the first and the second memory elements 108A and 108B of each twin memory cell 100 is determined in response to a voltage applied to the word gate 104.

As discussed above, each twin memory cell 100 has the first and the second MONOS memory elements 108A and 108B with split gates (that is, the first and the second control gates 106A and 106B). One word gate 104 is shared by the first and the second MONOS memory elements 108A and 108B.

The first and the second MONOS memory elements 108A and 108B independently function as trap sites of electric charges. Multiple word gates 104, which respectively control the trap of electric charges, are arrayed in the direction B (the row direction) at preset intervals as shown in FIG. 2, and are connected in common to one word line WL composed of, for example, polycide. Application of a preset control voltage to the word line WL enables selection of at least one of the first and the second memory elements 108A and 108B in each of the twin memory cells 100 on an identical row.

Each of the control gates 106A and 106B is extended in the column direction and is shared by multiple twin memory cells 100 arranged on an identical column, so as to function as a control gate line. The control gates 106A and 106B, which are included in two different but adjacent twin memory cells 100 in the row direction and adjoin to each other, are connected in common to a sub-control gate line SCG ( . . . SCG[i], SCG[i+1], . . . ). The sub-control gate lines SCG are composed of a metal layer, which is an upper layer than the word gates 104, the control gates 106A and 106B, and the word lines WL. The two memory elements 108A and 108B in each twin memory cell 100 are controlled independently by independent application of control voltages to the respective sub-control gate lines SCG, as discussed later.

An impurity layer 110 ( . . . , 110[i], 110[i+1], . . . ) is formed in the P type well 102 between each pair of adjoining memory elements 108A and 108B, which are included in two different but adjacent twin memory cells 100 in the row direction. Each of the impurity layers 110, for example, an n type impurity layer formed in the P type well 102, is extended in the column direction and is shared by multiple twin memory cells 100 arranged on an identical column, so as to function as a bit line BL ( . . . BL[i], BL[i+1]. . . ).

Application of a voltage to and detection of a current from the bit line BL enable electric charges (information) to be read and written (programmed) from and into one of the memory elements 108A and 108B in each twin memory cell 100 specified by the word line WL and the sub-control gate line SCG.

C. Structure and Operations of Voltage Generation Circuit

A plurality of different control voltages to be applied to the memory cell array 12 are required in respective operation modes, a Read mode, a Program mode, an Erase mode, and a Standby mode. The voltage generation circuit 26 thus generates diverse control voltages required for the respective operation modes.

Figure 3:
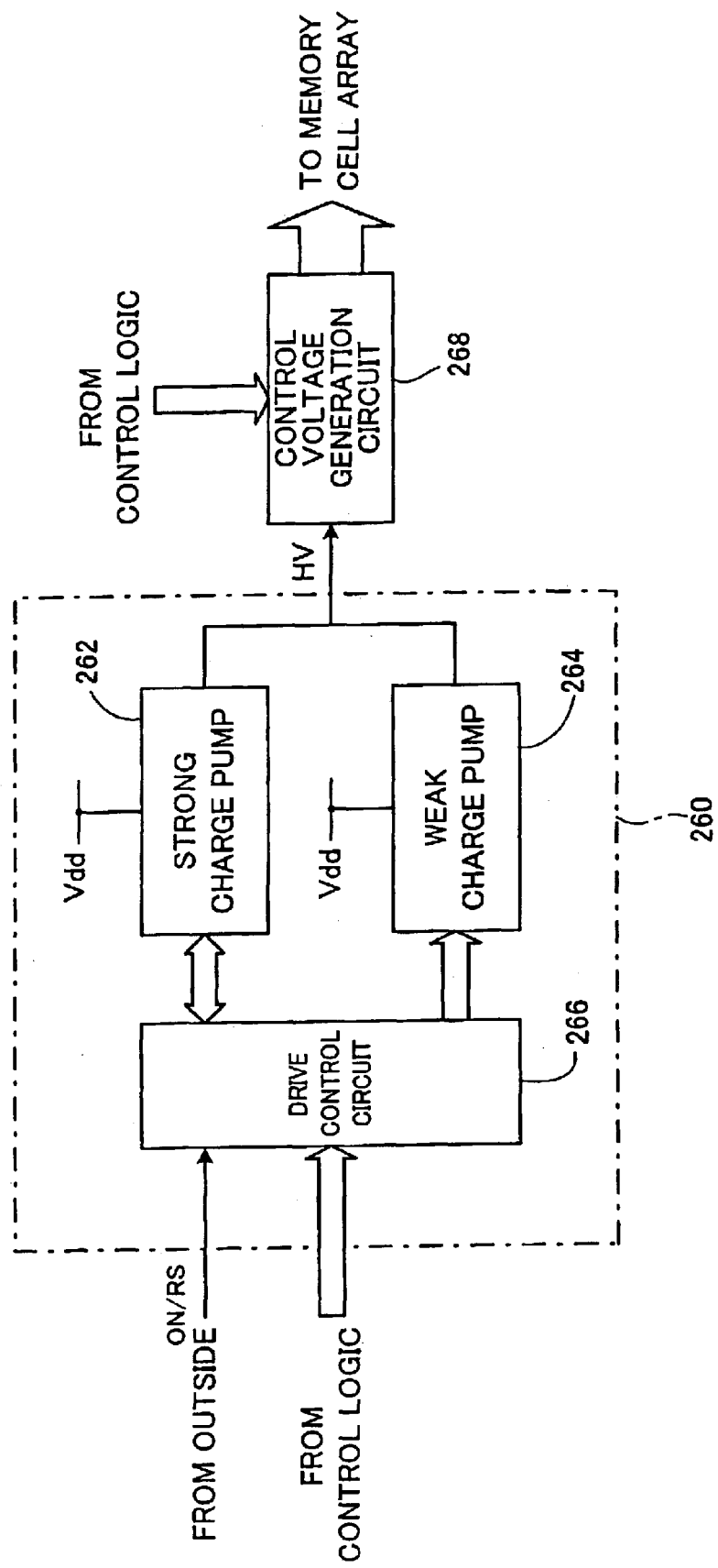
FIG. 3 is a block diagram showing the construction of a voltage generation circuit including a booster circuit in one embodiment of the present invention.

FIG. 3 is a block diagram showing the structure of the voltage generation circuit 26 including a booster circuit 260 in one embodiment of the present invention. As shown in FIG. 3, the voltage generation circuit 26 has a control voltage generation circuit 268, in addition to the booster circuit 260 of this embodiment.

The control voltage generation circuit 268 utilizes a boosted voltage HV output from the booster circuit 260 and generates a plurality of different voltages required for the respective operation modes, in response to control signals from the control logic 24. The control voltage generation circuit 268 is constructed by a diversity of general regulator circuits (not shown).

The booster circuit 260 boosts a power source voltage Vdd according to each operation mode in response to a control signal from the control logic 24, and outputs a desired boosted voltage HV. More specifically, the booster circuit 260 boosts the power source voltage Vdd of, for example, 1.8 V to a high voltage of 8.0 V and outputs the high voltage of 8.0 V in a Program (data writing) mode and in an Erase (data erasing) mode. The booster circuit 260 boosts the power source voltage Vdd of 1.8 V to a low voltage of 5.0 V and outputs the low voltage of 5.0 V in a Read (data reading) mode and in a Standby mode.

As shown in FIG. 3, the booster circuit 260 of this embodiment has a strong charge pump 262, a weak charge pump 264, and a drive control circuit 266. In response to control signals from the control logic 24, the drive control circuit 266 controls the strong charge pump 262 and the weak charge pump 264. In the active operation mode, for example, in the Read mode, in the Program mode, or in the Erase mode, the drive control circuit 266 drives the strong charge pump 262 to boost the power source voltage Vdd to the voltage corresponding to each operation mode and output the boosted voltage HV. In the Standby mode, on the other hand, the drive control circuit 266 drives the weak charge pump 264 to boost the power source voltage Vdd to the standby voltage and output the boosted voltage HV.

The strong charge pump 262 has a large current capacity supplied to a loading and is capable of ensuring a sufficient supply of electric power required for the memory cell array 12 in each active operation mode, for example, in the Read mode, in the Program mode, or in the Erase mode. The weak charge pump 264 has a smaller current capacity supplied to the loading than that of the strong charge pump 262, and is capable of keeping the standby voltage but is incapable of supplying the electric power required for the memory cell array 12 in the respective active operation modes. The weak charge pump 264 has less current consumption, due to the less current capacity, compared with the strong charge pump 262.

The drive control circuit 266 transmits the control signals output from the control logic 24 to the respective charge pumps 262 and 264.

The semiconductor memory device is generally in the Standby mode at a power supply ON time or at a reset time. As mentioned above, the weak charge pump 264 is generally driven in the Standby mode. The weak charge pump 264, however, has the small current capacity, and it takes a relatively long time to raise the boosted voltage HV from the power source voltage to the standby voltage.

In the structure of this embodiment, in response to input of an externally supplied power supply ON/reset signal ON/RS representing the power supply ON time or the reset time, even in the Standby mode, the drive control circuit 266 does not actuate the weak charge pump 264 but drives the strong charge pump 262 having the greater current capacity at the power supply ON time or at the reset time. This arrangement enables the boosted voltage HV to be quickly raised from the power source voltage to the standby voltage.

The strong charge pump 262, the weak charge pump 264, and the drive control circuit 266 in the structure of FIG. 3 respectively correspond to the first booster module, the second booster module, and the drive control module of the present invention.

D. Structure and Operations of Booster Circuit

Figure 4:
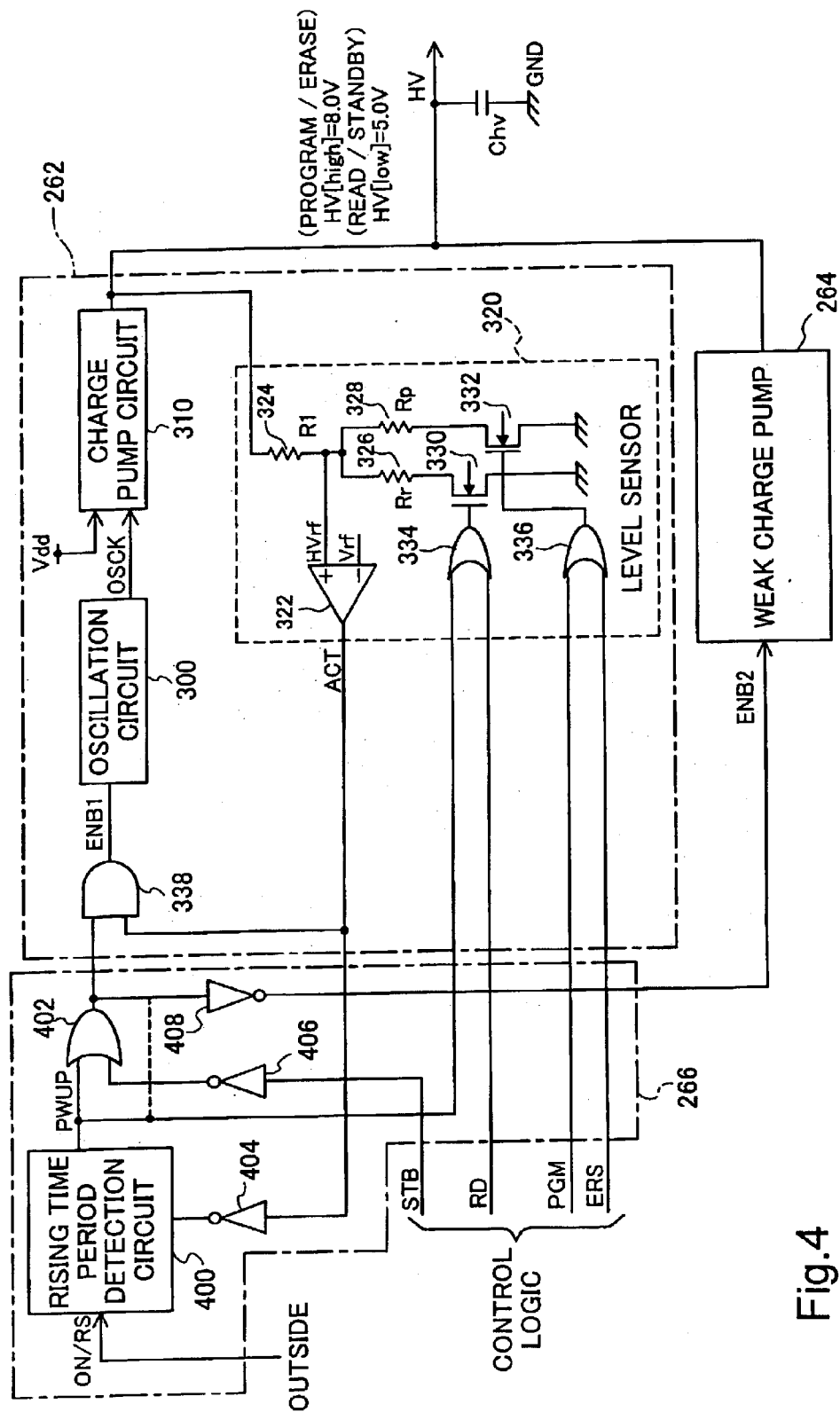
FIG. 4 is a circuit diagram showing the structure of the booster circuit of FIG. 3.

FIG. 4 is a circuit diagram showing the structure of the booster circuit 260 of FIG. 3. As shown in FIG. 4, the strong charge pump 262 included in the booster circuit 260 has an oscillation circuit 300, a charge pump circuit 310, and a level sensor 320.

The oscillation circuit 300 outputs a clock signal OSCK to the charge pump circuit 310, in response to an enable signal ENB1 from an AND gate 338. The oscillating operation of the oscillation circuit 300 stops when the enable signal ENB1 is at a low level (in an inactive state), while starting when the enable signal ENB1 is at a high level (in an active state).

The charge pump circuit 310 boosts the power source voltage Vdd and outputs the boosted voltage HV, in response to the clock signal OSCK supplied from the oscillation circuit 300. The charge pump circuit 310 has a sufficient current capacity to supply the generated voltage to a subsequent loading (for example, the memory cell array 12) in the active operation mode, for example, in the Read mode, in the Program mode, or in the Erase mode.

The level sensor 320 determines whether the output voltage (the boosted voltage) HV from the charge pump circuit 310 is higher or lower than the low voltage of 5.0 V at the power supply ON time and at the reset time (in the Standby mode) and in the Read mode and is higher or lower than the high voltage of 8.0 V in the Program mode and in the Erase mode, in response to a read signal RD, a programming signal PGM, and an erasing signal ERS supplied from the control logic 24 via the drive control circuit 266 and a detection signal PWUP supplied from the drive control circuit 266. The level sensor 320 then feeds back a detection signal ACT representing the result of the determination to the AND gate 338.

The oscillation circuit 300, the charge pump circuit 310, the level sensor 320 in the structure of FIG. 4 respectively correspond to the oscillation circuit, the charge pump circuit, and the level sense circuit of the present invention.

The level sensor 320 has a comparator 322. A reference voltage Vrf is input into a negative input terminal (−) of the comparator 322, whereas a detected voltage HVrf, which is part of the boosted voltage HV, is input into a positive input terminal (+) of the comparator 322.

The detected voltage HVrf is obtained by dividing the boosted voltage HV by means of a first voltage division circuit including a first resistor 324, a second resistor 326, and a first transistor 330 connected thereto in series or by means of a second voltage division circuit including the first resistor 324, a third resistor 328, and a second transistor 332 connected thereto in series.

An output terminal of an OR gate 334 is connected to a gate input terminal of the first transistor 330. The read signal RD representing the Read mode and the detection signal PWUP from the drive control circuit 266 (discussed later) are input into input terminals of the OR gate 334. The first transistor 330 functions as a switch that is turned ON when either one of the read signal RD and the detection signal PWUP is at the high level (in the active state). Similarly, an output terminal of an OR gate 336 is connected to a gate input terminal of the second transistor 332. The programming signal PGM representing the Program mode and the erasing signal ERS representing the Erase mode are input into input terminals of the OR gate 336. The second transistor 332 functions as a switch that is turned ON when either one of the programming signal PGM and the erasing signal ERS is at the high level (in the active state).

When the read signal RD or the detection signal PWUP is at the high level (in the active state) to turn the first transistor 330 ON, the boosted voltage HV is divided by means of the first resistor 324 and the second resistor 326 and is input into the comparator 322 as the detected voltage HVrf. When the programming signal PGM or the erasing signal ERS is at the high level (in the active state) to turn the second transistor 332 ON, on the other hand, the boosted voltage HV is divided by means of the first resistor 324 and the third resistor 328 and is input into the comparator 322 as the detected voltage HVrf.

The feedback circuit including the oscillation circuit 300, the charge pump circuit 310, and the level sensor 320 functions to make the detected voltage HVrf equal to the reference voltage Vrf.

Equations (1) and (2) given below are held on the assumption that the ON resistances of the first and the second transistors 330 and 332 are negligible:

$$HV[\text{low}] = Vrf \cdot (1 + R1/Rr) \qquad (1)$$

$$HV[\text{high}] = Vrf \cdot (1 + R1/Rp) \qquad (2)$$

Here R1, Rr, and Rp respectively denote resistances of the first through the third resistors 324, 326, and 328.

As clearly understood from Equations (1) and (2) given above, the low boosted voltage HV[low] for turning the first transistor 330 ON and the high boosted voltage HV[high] for turning the second transistor 332 ON are independently set by regulating the resistances R1, Rr, and Rp of the first through the third resistors 324, 326, and 328. In the structure of the embodiment, as mentioned previously, the low boosted voltage HV[low] to turn the first transistor 330 ON is set equal to 5.0 V at the power supply ON time and at the reset time (in the Standby mode) and in the Read mode. In the Program mode and in the Erase mode, the high boosted voltage HV[high] to turn the second transistor 332 ON is set equal to 8.0 V.

In the booster circuit 260, the oscillating operation of the oscillation circuit 300 and thereby the boosting operation of the charge pump circuit 310 are controlled according to the level of the boosted voltage HV detected by the level sensor 320. The charge pump circuit 310 is controlled to make the output voltage (boosted voltage) HV from the charge pump circuit 310 equal to the low boosted voltage HV[low] of 5.0 V at the power supply ON time and at the reset time (in the Standby mode) and in the Read mode and equal to the high boosted voltage HV[high] of 8.0 V in the Program mode and in the Erase mode.

The weak charge pump 264 included in the booster circuit 260 fundamentally has a similar structure to that of the strong charge pump 262 and includes an oscillation circuit (not shown), a charge pump circuit (not shown), and a level sensor (not shown).

In the weak charge pump 264, the oscillation circuit receives an enable signal ENB2 output from an inverter 408 in the drive control circuit 266, and outputs a clock signal to the charge pump circuit in response to the input enable signal ENB2. Compared with the charge pump circuit 310 in the strong charge pump 262, the charge pump circuit in the weak charge pump 264 has a smaller current capacity supplied to the subsequent loading (for example, the memory cell array 12). The charge pump circuit boosts the power source voltage Vdd and outputs the boosted voltage HV, in response to the clock signal output from the oscillation circuit. The level sensor simply determines whether the output voltage (boosted voltage) HV from the charge pump circuit is higher or lower than the standby voltage (5.0 V).

A pool capacitor Chv is disposed between output terminals of these charge pumps 262 and 264 and a reference potential point (GND). The pool capacitor Chv pools the boosted voltage HV.

The drive control circuit 266 includes a rising time period detection circuit 400, an OR gate 402, and inverters 404 through 408. The rising time period detection circuit 400 detects a time period between either the power supply ON time or the reset time and a time when the boosted voltage HV reaches the standby voltage (5.0 V) (rising time period), in response to the externally supplied power supply ON/reset signal ON/RS and the detection signal ACT output from the strong charge pump 262 and input via the inverter 404. The rising time period detection circuit 400 then outputs the detection signal PWUP representing a result of the detection. The OR gate 402 computes a logical sum of a standby signal STB output from the control logic 24 and input via the inverter 406 and the detection signal PWUP output from the rising time period detection circuit 400. The rising time period detection circuit 400 supplies the computed logical sum to the AND gate 338 in the strong charge pump 262, while supplying the logical sum as the enable signal ENB2 to the weak charge pump 264 via the inverters 404 through 408.

D-1. Operations at Power Supply ON Time or at Reset Time

Figure 5:
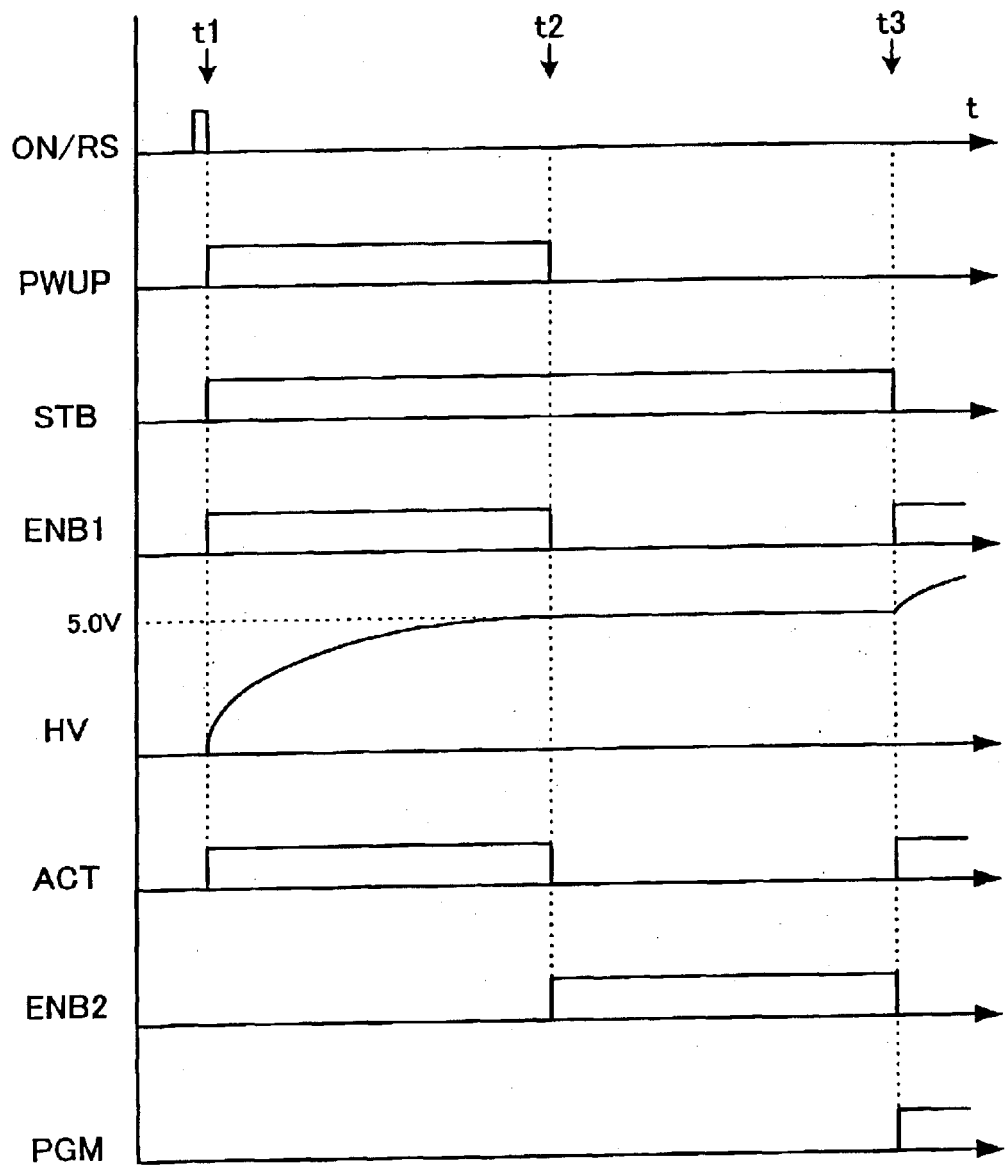
FIG. 5 is a timing chart showing timings of primary signals at a power supply ON time or at a reset time.

FIG. 5 is a timing chart showing timings of primary signals at the power supply ON time or at the reset time.

As shown in the timing chart of FIG. 5, when the power supply ON/reset signal ON/RS representing either the power ON operation or the reset operation of a semiconductor memory device is externally input into the drive control circuit 266, the rising time period detection circuit 400 makes the detection signal PWUP representing the rising time period rise to the high level (the active state) at a timing of a fall of the signal ON/RS (at a time point t1). At the time of the power ON operation or the reset operation of the semiconductor memory device, the operation mode starts from the Standby mode. The standby signal STB representing the Standby mode accordingly rises to the high level (the active state) and is output from the control logic 24 to the drive control circuit 266. The input standby signal STB is inverted to the low level by the inverter 406 and is input into one input terminal of the OR gate 402. The detection signal PWUP input into the other input terminal of the OR gate 402 is at the high level. The signal at the high level is accordingly output from the output terminal of the OR gate 402 and is input into one input terminal of the AND gate 338 in the strong charge pump 262.

In response to the power ON operation or the reset operation, the reference voltage Vrf is supplied to the negative input terminal (−) of the comparator 322 in the level sensor 320 of the strong charge pump 262. Since the detection signal PWUP output from the drive control circuit 266 has risen to the high level, the first transistor 330 is turned ON in the level sensor 320, and the boosted voltage HV is divided by means of the first resistor 324 and the second resistor 326 and is input as the detected voltage HVrf into the positive input terminal (+) of the comparator 322. At the power supply ON time or at the reset time, the boosted voltage HV is initially equal to the power source voltage. The detected voltage HVrf accordingly does not exceed the reference voltage Vrf. The detection signal ACT output from the comparator 322 is thus at the high level and is input into the other input terminal of the AND gate 338.

The enable signal ENB1 at the high level (in the active state) is output from the output terminal of the AND gate 338. The oscillation circuit 300 starts the oscillating operation in response to the active enable signal ENB1. On a start of the oscillating operation, the charge pump circuit 310 boosts the power source voltage Vdd in response to the clock signal OSCK supplied from the oscillation circuit 300. The boosted voltage HV output from the strong charge pump 262 then starts rising from the power source voltage. The charge pump circuit 310 in the strong charge pump 262 has the greater current capacity, compared with the charge pump circuit in the weak charge pump 264. The boosted voltage HV thus abruptly increases to the standby voltage of 5.0 V.

The signal at the high level is output from the output terminal of the OR gate 402. The enable signal ENB2 obtained by inverting the output signal by the inverter 408 thus falls to the low level and is input into the weak charge pump 264. The oscillation circuit in the weak charge pump 264 keeps stopping the oscillating operation.

At the power supply ON time or at the reset time, even in the Standby mode, only the strong charge pump 262 is driven, while the weak charge pump 264 is kept at a stop.

D-2. Operations after Reach to Standby Voltage

When the boosted voltage HV rises to reach the standby voltage (5.0 V) at a certain timing (at a time point t2), the detected voltage HVrf exceeds the reference voltage Vrf in the comparator 322. The detection signal ACT output from the comparator 322 accordingly falls to the low level.

The detection signal ACT output from the strong charge pump 262 is inverted to the high level by the inverter 404 in the drive control circuit 266 and is input into the rising time period detection circuit 400. The rising time period detection circuit 400 makes the detection signal PWUP fall to the low level (the inactive state) at the timing of a fall of this inverted signal (at the time point t2). The signal at the low level is output from the output terminal of the OR gate 402, while the standby signal STB is at the high level (in the active state) and the Standby mode continues. The enable signal ENB1 output from the output terminal of the AND gate 338 accordingly falls to the low level (the inactive state). The oscillation circuit 300 then stops the oscillating operation.

The signal at the low level is output from the output terminal of the OR gate 402. The enable signal ENB2 obtained by inverting the output signal by the inverter 408 accordingly rises to the high level and is input into the weak charge pump 264. The oscillation circuit in the weak charge pump 264 then starts the oscillating operation. On a start of the oscillating operation, in the weak charge pump 264, the charge pump circuit boosts the power source voltage Vdd in response to the clock signal supplied from the oscillation circuit and keeps the boosted voltage HV at the level of the standby voltage (5.0 V). Compared with the charge pump circuit 310 in the strong charge pump 262, the charge pump circuit in the weak charge pump 264 has the smaller current capacity. At this moment, there is no access to any memory element included in the memory cell array 12, and only a small electric power is required in the memory cell array 12. The small current capacity is thus sufficient. The less current consumption in proportion to the less current capacity desirably reduces the total current consumption by the booster circuit 260 in the Standby mode.

When the boosted voltage HV has reached the standby voltage (5.0 V), the ordinary operations in the Standby mode are resumed. Namely only the weak charge pump 264 is driven, while the strong charge pump 262 is at a stop.

D-3. Operations at Operation Mode Changeover Time

In response to a changeover of the operation mode from the Standby mode to, for example, the Program mode, at a certain timing (at a time point t3), the programming signal PGM representing the Program mode rises to the high level (the active state) and is output from the control logic 24 to the strong charge pump 262 via the drive control circuit 266. Simultaneously, the standby signal STB input into the drive control circuit 266 falls to the low level (the inactive state). The standby signal STB is inverted to the high level by the inverter 406 and is input into one input terminal of the OR gate 402. Even when the detection signal PWUP input into the other input terminal of the OR gate 402 is at the low level, the signal at the high level is output from the output terminal of the OR gate 402 to one input terminal of the AND gate 338.

In response to input of the programming signal PGM at the high level (in the active state), in the level sensor 320 of the strong charge pump 262, the second transistor 332 is turned ON, and the boosted voltage HV is divided by means of the first resistor 324 and the third resistor 328 and is input as the detected voltage HVrf into the comparator 322. Immediately after the changeover of the operation mode from the Standby mode to the Program mode, the detected voltage HVrf does not exceed the reference voltage Vrf. The detection signal ACT output from the comparator 322 thus rises to the high level and is input into the other input terminal of the AND gate 338.

The enable signal ENB1 rising to the high level (the active state) is output from the output terminal of the AND gate 338. The oscillation circuit 300 then resumes the oscillating operation. On a re-start of the oscillating operation, the charge pump circuit 310 boosts the power source voltage Vdd in response to the clock signal OSCK supplied from the oscillation circuit 300. The boosted voltage HV output from the strong charge pump 262 accordingly starts rising from the standby voltage (5.0 V) to the high voltage level of 8.0 V.

The signal at the high level is output from the output terminal of the OR gate 403. The enable signal ENB2 obtained by inverting the output signal by the inverter 408 accordingly falls to the low level and is input into the weak charge pump 264. The oscillation circuit in the weak charge pump 264 then stops the oscillating operation.

In the Program mode, only the strong charge pump 262 is driven, while the weak charge pump 264 is at a stop.

D-4. Effects of Embodiment

As described above, the structure of the embodiment drives the strong charge pump 262 to boost the power source voltage Vdd at the power supply ON time or at the rest time. The strong charge pump 262 has the greater current capacity and thereby enables the boosted voltage HV to be quickly raised from the power source voltage to the standby voltage (5.0 V), compared with the weak charge pump 264. The arrangement of this embodiment significantly shortens the time period required for boosting the voltage to the standby voltage level, thus remarkably reducing the time period between the power supply ON time or the reset time and the time to permit an access to the memory element (initial access permission time).

After the boosted voltage HV reaches the standby voltage, the requirement is to keep the standby voltage in the Standby mode. No problem accordingly arises when the weak charge pump 264 having the smaller current capacity is driven and used to boost the power source voltage Vdd. The arrangement stops the strong charge pump 262 having greater current consumption in proportion to the greater current capacity, while actuating the weak charge pump 264 having smaller current consumption in proportion to the smaller current capacity. This effectively reduces the total current consumption by the booster circuit in the Standby mode.

E. Modifications

The above embodiment and its applications are to be considered in all aspects as illustrative and not restrictive. There may be many modifications, changes, and alterations without departing from the scope or spirit of the main characteristics of the present invention.

The non-volatile memory elements 108A and 108B are not restricted to the MONOS structure. The technique of the present invention is applicable to non-volatile semiconductor memory devices using a diversity of other twin memory cells that include one word gate and first and second control gates to trap electric charges independently at two different positions.

In the above embodiment, the boosted voltage HV is equal to 5.0 V in the Standby mode and in the Read mode (that is, the standby voltage of 5.0 V), and is equal to 8.0 V in the Program mode and in the Erase mode. These values are, however, not restrictive, but a variety of other values may be applied for the boosted voltage HV.

In the embodiment discussed above, the drive control circuit 266 is constructed as a separate body from the control logic 24. The control logic 24 may have the functions of the drive control circuit 266. In this modified structure, the control logic 24 corresponds to the drive control module of the present invention.

The scope and spirit of the present invention are indicated by the appended claims, rather than by the foregoing description.

What is claimed is:

1. A booster circuit applied for a non-volatile semiconductor memory device, which comprises a memory cell array of multiple non-volatile memory elements and has multiple operation modes including a plurality of active modes to permit an access to one of the multiple non-volatile memory elements and a standby mode to stand ready for an access to one of the multiple non-volatile memory elements, the booster circuit boosting a power source voltage and outputting a boosted voltage according to each of the operation modes, the booster circuit comprising:
  a first booster module that is driven in each of the active modes to boost the power source voltage to a specified voltage according to the active mode and output the specified voltage as the boosted voltage;
  a second booster module that has a smaller current capacity supplied to the memory cell array than that of the first booster module, and is driven in the standby mode to boost the power source voltage to a standby voltage according to the standby mode and outputs the standby voltage as the boosted voltage; and
  a drive control module that controls actuation of the first booster module and the second booster module,
  at a power supply ON time or at a reset time of the non-volatile semiconductor memory device, the drive control module actuating the first booster module to make the boosted voltage rise to the standby voltage even when the operation mode is the standby mode.

2. A booster circuit in accordance with claim 1, wherein the drive control module stops the first booster module and actuates the second booster module, when it is detected that the boosted voltage reaches the standby voltage.

3. A booster circuit in accordance with claim 1, wherein each of the non-volatile memory elements in the non-volatile semiconductor memory device, for which the booster circuit is applied, is a twin memory cell controlled by one word gate and two control gates.

4. A booster circuit in accordance with claim 2, wherein each of the non-volatile memory elements in the non-volatile semiconductor memory device, for which the booster circuit is applied, is a twin memory cell controlled by one word gate and two control gates.

5. A booster circuit in accordance with claim 1, wherein each of the non-volatile memory elements in the non-volatile semiconductor memory device, for which the booster circuit is applied, has an ONO membrane that includes an oxide film (O), a nitride film (N), and an oxide film (O) and functions as a trap site of electric charges.

6. A booster circuit in accordance with claim 2, wherein each of the non-volatile memory elements in the non-volatile semiconductor memory device, for which the booster circuit is applied, has an ONO membrane that includes an oxide film (O), a nitride film (N), and an oxide film (O) and functions as a trap site of electric charges.

7. A booster circuit in accordance with claim 1, wherein the drive control module actuates the second booster module when the operation mode is one of the active modes.

8. A booster circuit in accordance with claim 2, wherein the drive control module actuates the second booster module when the operation mode is one of the active modes.

9. A booster circuit in accordance with claim 1, wherein each of the first booster module and the second booster module comprises:
  an oscillation circuit that carries out an oscillating operation to output a clock signal;
  a charge pump circuit that boosts the power source voltage and outputs the boosted voltage, in response to the clock signal output from the oscillation circuit; and
  a level sense circuit that controls the oscillating operation of the oscillation circuit to make the boosted voltage output from the charge pump circuit equal to a predetermined setting voltage according to each of the operation modes,
  the drive control module stops the first booster module or the second booster module by stopping the oscillating operation of the oscillation circuit included in the booster module.

10. A booster circuit in accordance with claim 2, wherein each of the first booster module and the second booster module comprises:
  an oscillation circuit that carries out an oscillating operation to output a clock signal;
  a charge pump circuit that boosts the power source voltage and outputs the boosted voltage, in response to the clock signal output from the oscillation circuit; and
  a level sense circuit that controls the oscillating operation of the oscillation circuit to make the boosted voltage output from the charge pump circuit equal to a predetermined setting voltage according to each of the operation modes,
  the drive control module stops the first booster module or the second booster module by stopping the oscillating operation of the oscillation circuit included in the booster module.

11. A voltage generation circuit used for the non-volatile semiconductor memory device, the voltage generation circuit comprising:
  a booster circuit in accordance with claim 1; and
  a control voltage generation circuit that receives the boosted voltage output from the booster circuit and generates a control voltage, which is used to implement a specific operation with regard to each of the non-volatile memory elements according to each of the operation modes.

12. A voltage generation circuit used for the non-volatile semiconductor memory device, the voltage generation circuit comprising:
  a booster circuit in accordance with claim 2; and
  a control voltage generation circuit that receives the boosted voltage output from the booster circuit and generates a control voltage, which is used to implement a specific operation with regard to each of the non-volatile memory elements according to each of the operation modes.

13. A non-volatile semiconductor device comprising a booster circuit in accordance with claim 1.

14. A non-volatile semiconductor device comprising a booster circuit in accordance with claim 2.

* * * * *